United States Patent [19]

Hindman et al.

[11] Patent Number: 5,240,880
[45] Date of Patent: Aug. 31, 1993

[54] TI/TIN/TI CONTACT METALLIZATION

[75] Inventors: Gregory Hindman; Jack Berg; Peter N. Manos, II, all of Boise, Id.

[73] Assignee: Zilog, Inc., Campbell, Calif.

[21] Appl. No.: 878,626

[22] Filed: May 5, 1992

[51] Int. Cl.$^5$ .......................................... H01L 21/283
[52] U.S. Cl. .................... 437/190; 437/192; 437/200; 204/192.17
[58] Field of Search .............. 437/190, 192, 200; 204/192.17; 357/71; 257/751, 763, 770

[56]  References Cited

U.S. PATENT DOCUMENTS

| | | | |
|---|---|---|---|
| 4,783,248 | 11/1988 | Kohlhase et al. | 204/192.17 |
| 5,049,975 | 9/1991 | Ajika et al. | 357/71 |
| 5,136,362 | 8/1992 | Grief et al. | 257/751 |

FOREIGN PATENT DOCUMENTS 58-101454  6/1983  Japan ............................ 204/192.17

OTHER PUBLICATIONS

Gilboa, Haim, et al.; "Sequential Sputter Deposition of Titanium Nitride and Aluminum"; IEEE VMIC Conference, Jun. 12-13, 1990; pp. 338-341.

Maeda, T., et al.; "Ti Thickness Optimization of TiN/Ti Barrier Metal Structure Based Upon $BF_2^+$ Induced Damage Analysis"; IEEE V-MIC Conference, Jun. 9-10, 1986; pp. 411-417.

Suni, I., et al.; "Performance of titanium nitride diffusion barriers in aluminum-titanium metallization schemes for integrated circuits"; *J. Vac. Sci. Technol. A;* vol. 3, No. 6; Nov./Dec. 1985; pp. 2233-2236.

Maeda, T., et al.; "A Highly Reliable Interconnection for a $BF_2^+$-Implanted Junction Utilizing a TiN/Ti Barrier Metal System"; *IEEE Transactions on Electron Devices;* vol. ED-34, No. 3, Mar. 1982; pp. 599-605.

*Primary Examiner*—T. N. Quach
*Attorney, Agent, or Firm*—Majestic, Parsons, Siebert & Hsue

[57]  ABSTRACT

The present invention concerns a method for contact metallization on a semiconductor where a contact hole is formed in an interlevel dielectric layer down to a doped silicon region on the silicon substrate, and then the wafer is placed into a sputtering chamber where titanium is sputtered onto the wafer. A titanium nitride layer is sputtered on top of the titanium layer in the contact hole. This invention saves time and money, because the titanium nitride layer depositing and titanium layer forming steps can occur in the same chamber without forming the boro-phosphorous silicate glass layer in between. The titanium layer reacts with the silicon to form a silicide layer at the time of the sputtering in a hot deposition or in later steps that supply heat to the wafer for a period of time. Optionally, an additional titanium layer can be formed on top of the titanium nitride layer to clean off the titanium target used to sputter the titanium and titanium nitride layers on the wafer. A metal layer including aluminum is then formed on top of the titanium layer or the titanium nitride layer to form the contact metallization with the doped silicon region in the semiconductor.

1 Claim, 2 Drawing Sheets

TI/TIN/TI CONTACT METALLIZATION

BACKGROUND OF THE INVENTION

This invention relates to a method of forming a contact metallization to a doped silicon region on a silicon substrate in a semiconductor. Specifically, this invention relates to methods using a titanium nitride (TiN) layer.

A prior art contact metallization method is described with respect to FIG. 1. A silicide layer is formed on the semiconductor wafer comprising the silicon substrate 2 with field oxide regions 4 and doped silicon regions 4. The silicide layer 8 is formed by sputtering a titanium layer off of a titanium target so that titanium is deposited on the wafer.

After sputtering the titanium on to the wafer, the wafer is put into a furnace or a rapid thermal processor. The titanium forms a silicide layer 8 when the titanium reacts with the silicon. The silicide layer typically has the formula $TiSi_2$, but this silicide layer 8 may also contain intermediate compounds.

The titanium that is on the field oxide regions 4 will not react to form silicide. This titanium on the field oxide regions would short the semiconductor chip if not removed. The undesired titanium on top of the field oxide 4 is removed with a wet etch before an interlevel dielectric is placed on top of the wafer.

The silicide layer 8 is necessary because titanium nitride has a high contact resistance with the silicon in the doped silicon region 6. The silicide layer 8 has a low contact resistance with the doped silicon region 6.

A layer of an interlevel dielectric such as borophosphorous silicate glass or BPSG 10 is deposited over the top of the wafer. Contact holes are created in the BPSG layer 10 and typically, the BPSG layer 10 is heated so that it reflows to form a smooth surface. A layer of titanium nitride 12 is then formed on top of the BPSG layer 10 and the silicide layer 8. The titanium nitride layer 12 is formed by sputtering titanium from a titanium target in a chamber containing nitrogen gas so that the titanium reacts with the nitrogen gas to form titanium nitride. This titanium nitride forms a layer over the BPSG layer 10 and the silicide layer 8. The titanium nitride (TiN) layer 12 has a low contact resistance with the silicide layer 8. The titanium nitride layer 12 is used as a barrier metal to prevent spiking and epitaxial silicon growth in the contact hole. Spiking may cause a sputtered aluminum layer to drive through the doped silicon junction.

A metal layer including aluminum 14 is then sputtered on top of the titanium nitride layer 12. The metal layer 14 includes aluminum and may include other alloying elements. The titanium nitride layer 12 has a low contact resistance with the metal layer including aluminum and the silicide layer. The titanium nitride layer has a high electromigration resistance.

In the contact metallization, there is a problem with electromigration. Electromigration occurs when the cross-section of the metallic layer is small and therefore the current density going through the metallic layer is high. This high current density causes kinetic energy to transfer to the metal atoms which migrate away from the narrow cross-section. Faults caused by electromigration are problematic because they might not be found when the semiconductor chip is tested after production, but could occur after the testing when sufficient current has been put through the aluminum layer 14. The titanium nitride layer 12 resists the electromigration of the metal atoms.

Since the metal layer including aluminum 14 has a low contact resistance with the titanium nitride layer 12, and the silicide layer 8 also has a low contact resistance with the titanium nitride layer 12, the total contact resistance of the junction is low. The silicide layer 8 is necessary because of the high contact resistance between the doped silicon region and the titanium nitride layer.

This prior art process, however, does have disadvantages. The cost and time needed to produce a silicon chip depend upon the number of steps involved. It is therefore an object of the present invention to have a method of forming a titanium nitride contact metallization using fewer steps than the prior art methods.

SUMMARY OF THE INVENTION

An advantage of the present invention is that the silicide layer and the titanium nitride layer can be formed in the same chamber without any intermediate steps requiring the wafers to be removed from this chamber. This advantage saves time and money in the production of the semiconductor chip.

In accordance with the principles of the present invention, the above and other objectives are realized by using a method of forming a contact metallization to a doped silicon region on a silicon wafer through an interlevel dielectric layer. This method comprises forming a contact hole in the interlevel dielectric layer; thereafter, depositing titanium into the contact hole; thereafter, depositing a titanium nitride layer in the contact hole; thereafter, depositing an metal layer including aluminum in the contact hole; and heating the wafer so that at least some of the titanium reacts with the silicon in the doped silicon region to form a silicide layer.

Additionally, the above and other objectives are realized by using a semiconductor circuit including a metallic contact to a doped silicon region where the semiconductor circuit comprises a silicon substrate doped in at least certain regions, an interlevel dielectric layer on top of and contacting the silicon substrate, a silicide layer on a doped region of the silicon substrate, where the interlevel dielectric is not on top of and contacting the silicide layer, a titanium nitride layer over said silicide layer, and an aluminum layer over said titanium nitride layer where said aluminum layer is in electrical contact with the doped silicon region.

BRIEF DESCRIPTION OF THE DRAWINGS

The above and other features and aspects of the present invention will become more apparent upon reading the following detailed description in conjunction with the accompanying drawings, in which.

DETAILED DESCRIPTION OF THE PREFERRED EMBODIMENT

Figure 3:
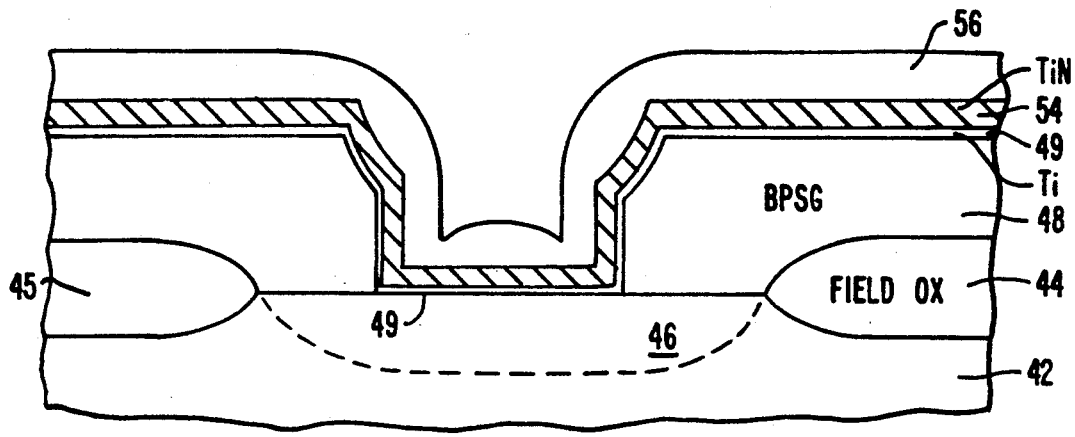
FIG. 3 is a cross-sectional view of the contact metallization of the present invention showing the titanium layer before it reacts to form a silicide layer.

FIG. 3 is a cross-sectional view semiconductor wafer showing the contact metallization of the present invention. Shown is the silicon substrate 42, field oxide layers 44 and 45, and the doped silicon region 46. An interlevel dielectric such as boro-phosphorous silicate glass or BPSG 48 is placed over the wafer. BPSG is the interlevel dielectric used in the preferred embodiment, but other interlevel dielectrics such as phosphorous silicon glass or PSG could be used. A contact hole is formed by etching through the BPSG layer.

In the preferred embodiment, the BPSG layer is not reflowed to round the corners of the BPSG after the contact hole is formed. The heat required in the reflow of the BPSG can cause the Boron to deplete from the P+ doped silicon region to the grown oxide and has been found to increase the P+ junctions' contact resistance.

The wafer is then placed into a sputtering chamber, and titanium is sputtered onto the wafer off of a titanium target in the presence of argon. In the preferred embodiment, the sputtering chamber is a subchamber of a large vacuum chamber. Alternately, a single vacuum chamber may be used as the sputtering chamber. This titanium layer 49 contacts the silicon substrate at the bottom of the contact hole. The deposition of the titanium can be a cold deposition or a hot deposition. In a cold deposition, the titanium does not immediately form a silicide layer but the silicide layer is formed in later heating steps. In a hot deposition, the wafer is heated to about 300° C. during the deposition process and a thin layer of the titanium immediately reacts to form silicide.

Figure 4:
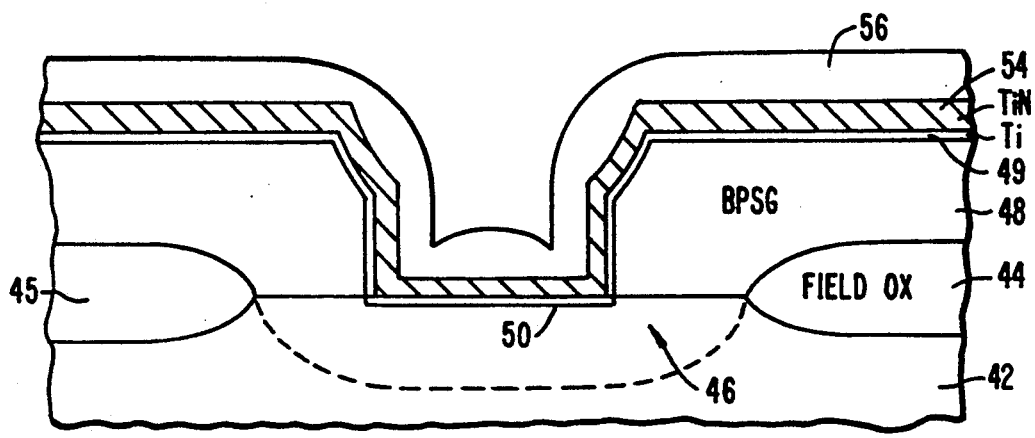
FIG. 4 is a cross-sectional view of the contact metallization of the present invention showing the silicide layer formed in the contact hole.

FIG. 4 shows a silicide layer 50 formed in the bottom of the contact hole. This silicide layer 50 is formed when the wafer is heated so that the silicon in the doped silicon junction reacts with the titanium. The silicide layer 50 typically has the formula $TiSi_2$, but this silicide layer 50 may also contain intermediate compounds. This silicide layer 50 may be formed after the Ti/TiN deposition in a later step such as the alloy step. In the alloy step, the wafer is heated to 400° C. for an hour or ninety minutes. Even in a hot deposition, the silicide layer may grow during a later heating step.

Figure 1:
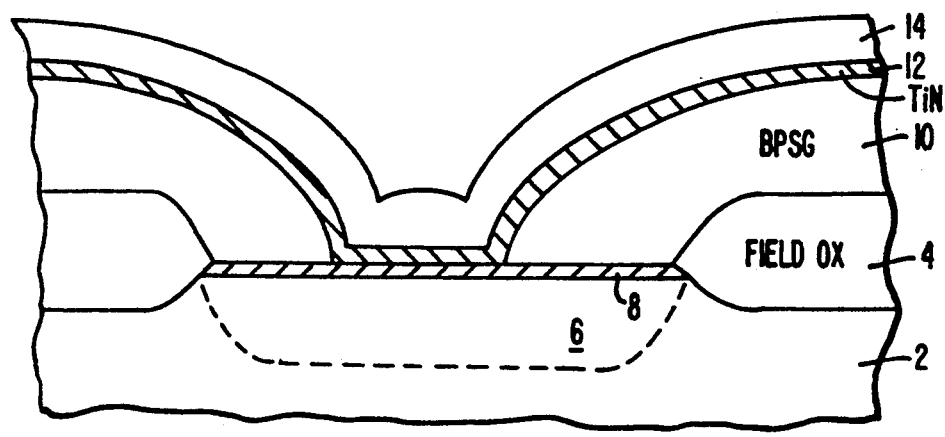
FIG. 1 is a cross-sectional view of the prior art contact metallization using a silicide layer and a titanium nitride layer.
Figure 2:
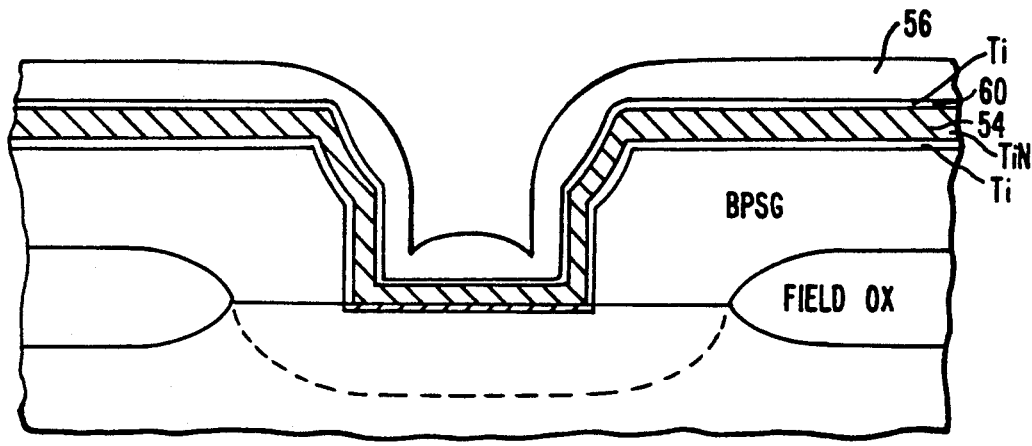
FIG. 2 is a cross-sectional view of the contact metallization of the present invention showing an additional titanium layer on the titanium nitride layer.

Although FIGS. 2 and 4 show all the titanium above the contact hole reacted to form the silicide layer, it is to be understood that some unreacted titanium may cover the silicide layer and thus be underneath the titanium nitride layer.

After the titanium is sputtered, nitrogen gas is introduced into the sputtering chamber along with the argon. The nitrogen gas can form 20% to 70% of the gas in the chamber. The titanium target is sputtered in the presence of the nitrogen gas so that the titanium reacts with the nitrogen gas to form titanium nitride, which is deposited in a titanium nitride layer 54 on top of the titanium and/or silicide layers. It takes a few seconds for the nitrogen gas to be introduced into the chamber so that the contact metallization layers will gradually go from 100% titanium to 100% titanium nitride. Therefore, although FIG. 3 shows a sharp transition between the titanium and titanium nitride layers, in actuality the transition between these layers is gradual.

The wafers are then removed from the sputtering chamber and placed in an aluminum sputtering chamber to sputter a metal layer including aluminum 56 on top thereof. This metal layer typically comprises aluminum with alloying elements such as silicon in amounts less than 2% and copper in amounts less than 4%. The metal layer may contain other alloying elements as well. The aluminum sputtering chamber may be a sub-chamber of the large vacuum chamber. In the preferred embodiment, the Ti layer is around 300 angstroms thick, the titanium nitride layer is around 1000 angstroms thick and the metal layer including aluminum is around 5000 angstroms thick. The titanium layer thicknesses are not critical, but too much titanium may cause the silicide layer to react through the doped silicon region. Additionally, the titanium nitride layer and metal layer including aluminum may be twice or half as thick without any problems.

One benefit of the present invention is that the titanium layer used to form a silicide layer 50 and the titanium nitride layer 54 can be formed in the same sputtering chamber without removing the wafer to form a BPSG layer. The titanium and titanium nitride layers can be created without stopping the deposition process by changing the gas present in the sputtering chamber.

Another benefit is that the aluminum, titanium, and titanium nitride layers can be etched together in the same etching step. No additional etch solely for the titanium layer covering the field oxide or polysilicon is needed, because the unreacted titanium covers the interlevel dielectric and can be removed along with the titanium nitride and metal layer including aluminum.

Optionally, looking at FIG. 2, after the titanium nitride layer 54 is formed in the chamber, the supply of the nitrogen to the sputtering chamber can be stopped while the deposition off the titanium target continues, so as to form an additional titanium layer 60 on top of the titanium nitride layer 54. This additional titanium layer depositing step has the benefit of removing the nitrogen species that have attached themselves to the surface of the titanium target in the sputtering chamber. These traces of titanium nitride in the titanium target would otherwise be mixed with the titanium used to form silicide layer and would cause this silicide layer to be of a poor quality with a high contact resistance. This additional titanium layer may also be made without stopping the deposition process. This additional titanium layer does not adversely affect the contact metallization resistance of the junction. The metal layer including aluminum 56 is then placed on top of the second titanium layer 60.

Figure 5:
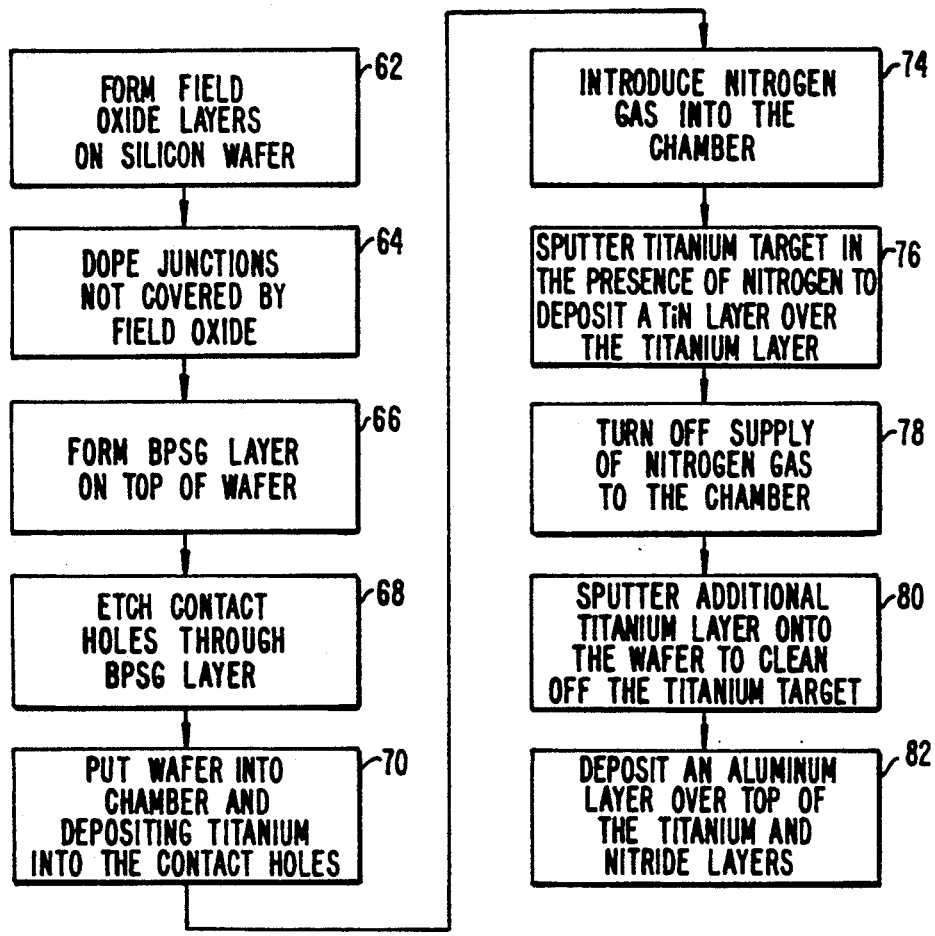
FIG. 5 is a flow chart showing the steps involved in the production of wafers according to the present invention.

FIG. 5 shows the steps involved in this alternate contact metallization method. Steps 62 through 68 show the steps up to the forming of the contact holes in the BPSG. Step 70 describes the placing of the wafer into the sputtering chamber and depositing titanium into the contact holes. This step is done by sputtering off the titanium target in the chamber. Step 74 involves introducing nitrogen gas into the chamber. Step 76 is sputtering off the titanium target in the presence of nitrogen gas to deposit a titanium nitride layer over the silicide layer. The titanium from the target reacts with the nitrogen gas to form a titanium nitride layer which forms a layer on the titanium layer and any silicide that has yet formed. Step 78 involves turning off the supply of the nitrogen gas to the chamber. Step 80 involves sputtering titanium off the titanium target to form an additional titanium layer so as to clean off the titanium target. Step 82 involves depositing a metal layer including aluminum over top of the titanium and titanium nitride layers.

Various details of the implementation and method are merely illustrative of the invention. It will be understood that various changes in such details may be within the scope of the invention, which is to be limited only by the appended claims.

What is claimed is:

1. A method of forming a contact metallization to a doped silicon region on a silicon wafer through an interlevel dielectric layer, said method comprising:

forming a contact hole in the interlevel dielectric layer;

thereafter, depositing titanium in the contact hole, said titanium deposition step including sputtering titanium from a titanium target to a wafer in a sputtering chamber;

thereafter, depositing a titanium nitride layer in the contact hole by introducing nitrogen gas into the sputtering chamber and sputtering off of the titanium target so that a titanium nitride layer is formed on the wafer;

stopping the supply of nitrogen gas to the sputtering chamber and sputtering a top titanium layer on top of the titanium nitride layer in a manner that nitrogen species that have attached themselves to the target during the titanium nitride deposition step are removed from the target;

thereafter, depositing a metal layer including aluminum on the top titanium layer in the contact hole; and heating the wafer so at least some of the titanium in the first titanium layer reacts with the silicon in the doped silicon region to form a silicide layer.

* * * * *